(12) United States Patent
Yang et al.

(10) Patent No.: US 7,692,314 B2
(45) Date of Patent: Apr. 6, 2010

(54) WAFER LEVEL CHIP SCALE PACKAGE AND METHOD FOR MANUFACTURING THE SAME

(75) Inventors: Se-Young Yang, Seoul (KR); Wang-Ju Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 158 days.

(21) Appl. No.: 11/845,718

(22) Filed: Aug. 27, 2007

(65) Prior Publication Data

US 2008/0061436 A1 Mar. 13, 2008

(30) Foreign Application Priority Data

Sep. 7, 2006 (KR) .................. 10-2006-0086350

(51) Int. Cl.
*H01L 23/48* (2006.01)
(52) U.S. Cl. .................. 257/780; 257/779
(58) Field of Classification Search .......... 257/779, 257/780
See application file for complete search history.

(56) References Cited

U.S. PATENT DOCUMENTS

| | | | |
|---|---|---|---|
| 6,287,893 B1 * | 9/2001 | Elenius et al. | 438/108 |
| 6,441,487 B2 * | 8/2002 | Elenius et al. | 257/738 |
| 7,358,178 B2 * | 4/2008 | Lua et al. | 438/617 |
| 7,491,636 B2 * | 2/2009 | Farnworth | 438/598 |
| 2005/0242427 A1 * | 11/2005 | Yang | 257/692 |
| 2005/0282315 A1 * | 12/2005 | Jeong et al. | 438/125 |

FOREIGN PATENT DOCUMENTS

| | | |
|---|---|---|
| JP | 5-136198 | 6/1993 |
| KR | 10-2004-0035383 | 4/2004 |
| KR | 10-2004-0083192 | 10/2004 |
| KR | 10-2005-0116704 | 12/2005 |

* cited by examiner

*Primary Examiner*—Douglas M Menz
(74) *Attorney, Agent, or Firm*—Marger Johnson & McCollom, P.C.

(57) ABSTRACT

Provided is a wafer level chip scale package that reduces the parasitic capacitance generated between ball pads and the solder balls, and enhances the joint reliability between the ball pads and the solder balls. The wafer level chip scale package provides a conductive pattern in each ball pad section, on which a solder ball is mounted, so as to have a spiral or mesh shape, provides a space defined by the conductive pattern such that a first dielectric layer under the conductive pattern is exposed, and provides the solder ball on a top surface of each ball pad section such that part of the solder ball is inserted into the space defined by the conductive pattern. When viewed from the top, the dielectric layer is exposed from each ball pad section by an area of about 50% or less.

7 Claims, 5 Drawing Sheets

WAFER LEVEL CHIP SCALE PACKAGE AND METHOD FOR MANUFACTURING THE SAME

CROSS-REFERENCE TO RELATED APPLICATIONS

This U.S. non-provisional patent application claims priority under 35 U.S.C. § 119 to Korean Patent Application No. 2006-86350, filed on Sep. 7, 2006, the entire contents of which are hereby incorporated by reference.

BACKGROUND

1. Technical Field

The present invention disclosed herein relates to a chip scale package and a method for manufacturing the same, and more particularly, to a wafer level chip scale package (WL-CSP), and a method for manufacturing the same, capable of enhancing the reliability of joints between solder balls and ball pads that are formed by redistribution of chip pads.

2. Description of the Related Art

Recently, the electronics industry has been focusing on manufacturing products having light weight, small size, high speed, multi-functions, high performance, and high reliability at a low cost. One of the important techniques that make it possible to attain the goal of this product design is a package assembly technique. A chip scale package (or a chip size package) is a new type of package that has recently been developed, and has many advantages compared to a typical plastic package. The biggest advantage of the chip scale package is the package size. The international semiconductor associations, such as Joint Electron Device Engineering Council (JEDEC) and Electronic Industry Association of Japan (EIAJ), define the chip scale package as having a package size no greater than 1.2 times a chip size.

The chip scale package is mainly used in products, such as digital camcorders, mobile phones, laptop computers, and memory cards, for which miniaturization and mobility are required. Semiconductor devices, such as a digital signal processor (DSP), an application specific integrated circuit (ASIC), a micro-controller, etc., are mounted in the chip scale package. Further, the use of the chip scale package having a memory device, such as a dynamic random access memory (DRAM) or a flash memory, is gradually spreading. Currently, at least 50 types of chip scale packages are developed or produced all over the world.

In general, when a semiconductor wafer is produced through a wafer manufacturing process, individual chips are separated from the wafer and undergo a package assembly process. The package assembly process is separate from the wafer production process because the equipment and raw and subsidiary materials for the package assembly process are different from those for the wafer manufacturing process. However, when chip scale packages are manufactured at the wafer level, the package is produced as a complete product without separating the individual chips from the wafer. As such, the existing equipment and processes for manufacturing the wafer can also be used for producing the package. This means that the raw and subsidiary materials, which are additionally necessary to produce the chip scale package, can be reduced.

FIG. 1 is a plan view of a chip scale package according to the conventional art. FIG. 2 is a cross-sectional view of the chip scale package of FIG. 1 taken along the line I-I. Referring to FIGS. 1 and 2, the chip scale package 20 includes a substrate 14, which may be a portion of a semiconductor wafer 12. Chip pads 11 are formed on the substrate 14. A passivation layer 22 is formed on the substrate 14 and the chip pads 11 such that portions of the chip pads 11 are exposed through the passivation layer 22. A first dielectric layer 25 is formed on the passivation layer 22 and defines openings exposing the chip pads 11. Metal trace layer patterns 21 are disposed on the first dielectric layer 25 and electrically connect the chip pads 11 to the solder balls 28. The metal trace layer patterns 21 include ball pad sections 23 where the solder balls 28 are placed. A second dielectric layer 24 is formed on the metal trace layer patterns 21 and the first dielectric layer 25. The second dielectric layer 24 defines openings 27 that expose the ball pad sections 23.

According to the conventional method, as illustrated in FIGS. 1 and 2, the contact surface area between the solder balls 28 and the ball pad sections 23 is limited to the flat surface area of the ball pad sections 23. Thus, the reliability of the joints between the solder balls 28 and the ball pad sections 23 is fixed. Further, since the ball pad sections 23 are circular metal plates, undesirable parasitic capacitance associated with the ball pad sections 23 is maximized. The present invention addresses these and other disadvantages of the conventional art.

SUMMARY

The present invention provides a wafer level chip scale package, and a method for manufacturing the same, capable of enhancing electrical properties and reliability of the joints between the solder balls and ball pads.

Embodiments of the present invention provide a wafer level chip scale package, which includes an integrated circuit (IC) chip, the IC chip including a plurality of chip pads and a passivation layer exposing the chip pads on a top surface thereof; a first dielectric layer disposed on the passivation layer and defining first openings such that the chip pads are exposed; ball pad sections having conductive patterns protruding from the first dielectric layer and exposing a portion of the first dielectric layer; trace layer patterns disposed on the first dielectric layer so as to connect the conductive patterns of the ball pad sections with the chip pads; a second dielectric layer formed on the trace layer patterns and the first dielectric layer such that the ball pad sections are exposed; and conductive balls mounted to the ball pad sections and electrically connected with the conductive patterns of the ball pad sections.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
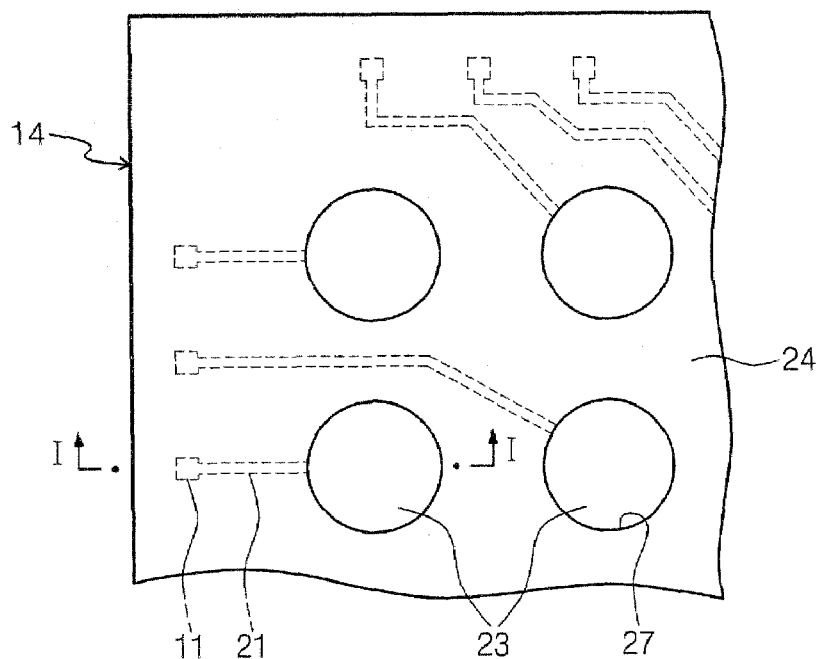
FIG. 1 is a plan view of a chip scale package according to the conventional art.
Figure 2:
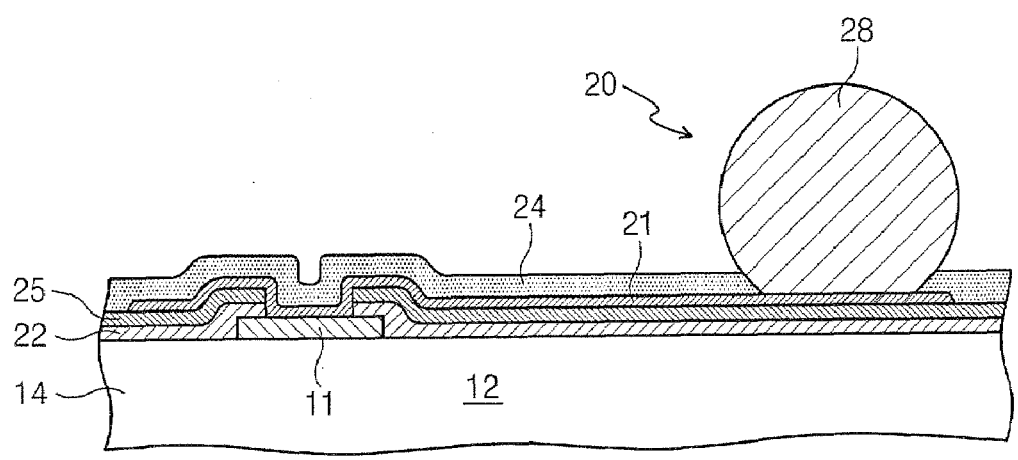
FIG. 2 is a cross-sectional view of the chip scale package of FIG. 1 taken along the line I-I.

Exemplary embodiments of the present invention will be described below in detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 3:
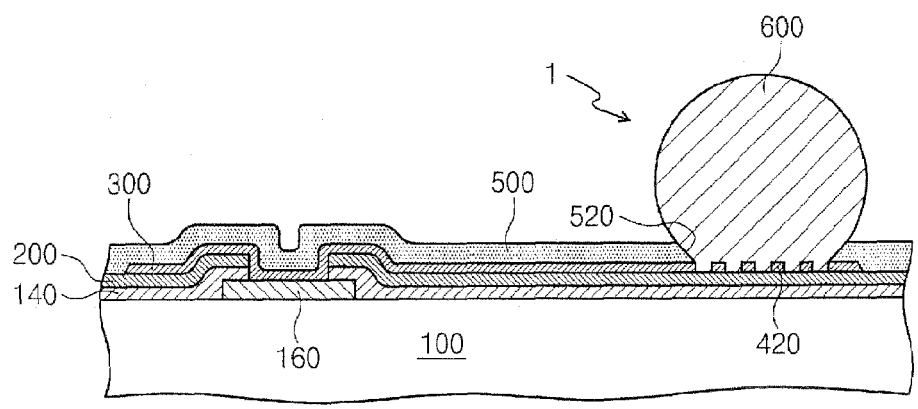
FIG. 3 is a cross-sectional view illustrating a wafer level chip scale package (WL-CSP) according to embodiments of the present invention.
Figure 10:
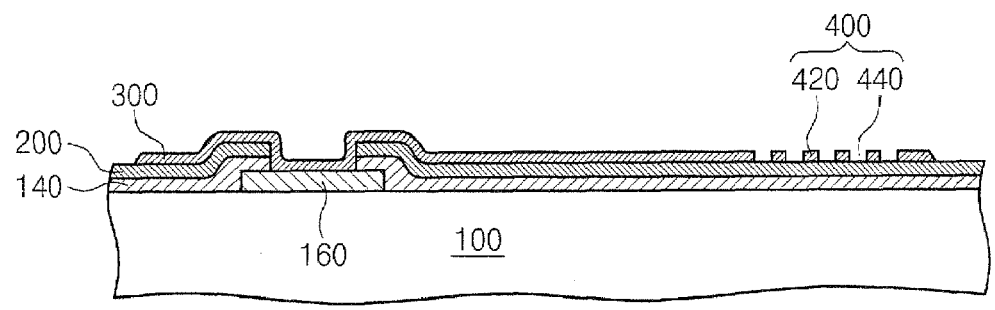

FIG. 3 is a cross-sectional view illustrating a wafer level chip scale package (WL-CSP) 1 according to some embodiments of the present invention. Referring to FIG. 3, the WL-CSP 1 includes a semiconductor wafer 100, a first dielectric layer 200, metal trace layer patterns 300, ball pad sections 400 (see FIG. 10), a second dielectric layer 500, and solder balls 600. The semiconductor wafer 100 has a plurality of integrated circuits (not shown), which can be formed through a conventional wafer manufacturing process. The integrated circuits of the semiconductor wafer 100 are formed as a number of semiconductor chips, and neighboring semiconductor chips are divided by a chip cutout region (or a scribe line). The integrated circuit formed as the semiconductor chip is not a main feature of the present invention, so the detailed description thereof will be omitted.

The semiconductor wafer 100 has chip pads 160 formed on the top surface thereof. The chip pads 160 are electrically connected with the integrated circuits. Further, a passivation layer 140 is formed on the top surface of the semiconductor wafer and on an edge of each chip pad 160. The passivation layer 140 protects the integrated circuits of the semiconductor wafer 100 from the external environment. Each chip pad 160 includes aluminum, and the passivation layer 140 includes oxide or nitride.

Figure 8:
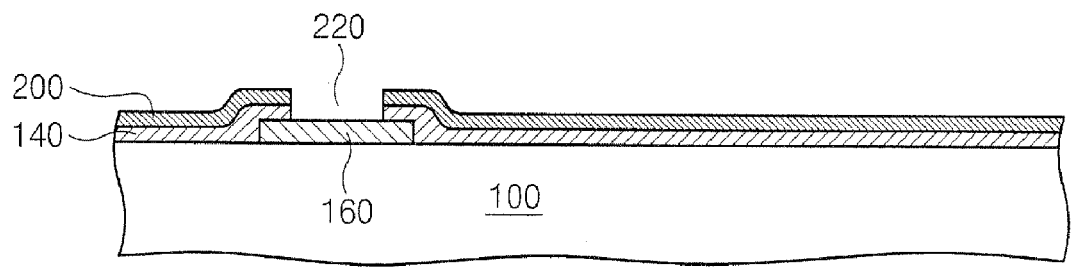
Figure 12:
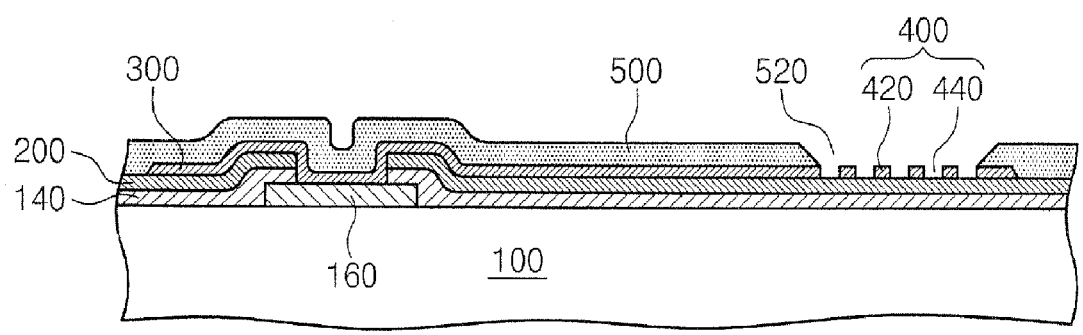

The first dielectric layer 200 is formed on the passivation layer 140. The first dielectric layer 200 has holes 220 such that the chip pads 160 can be exposed (see FIG. 8). The ball pad sections 400 are formed on predetermined regions of the first dielectric layer 200. The ball pad sections 400 are bonded with the solder balls 600, and are prepared as the combination of a concavity and a convexity. In each ball pad section 400, a conductive pattern 420 protruding from the first dielectric layer 200 is provided as the convexity, whereas a space 440 defined by the conductive pattern 420 is provided as the concavity (see FIG. 12). When viewed from the top of each ball pad section 400, the first dielectric layer 200 is exposed through the space 440 defined by the conductive pattern 420. A detailed shape of each ball pad section 400 will be described below.

Figure 9:
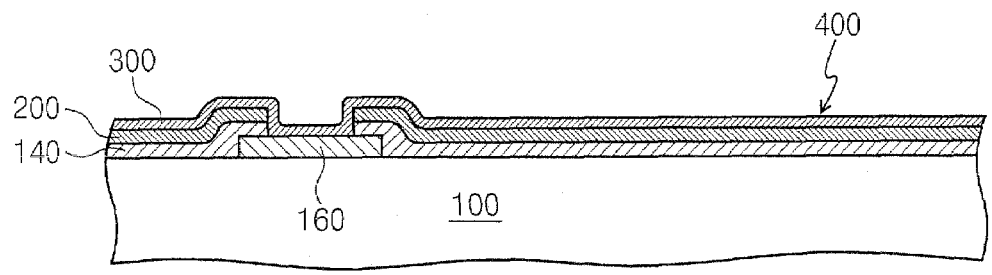

The metal trace layer patterns 300, which electrically connect the conductive patterns 420 of the ball pad sections 400 and the chip pads 160, are formed on the first dielectric layer 200. The metal trace layer patterns 300 may include copper or aluminum. The metal trace layer patterns 300 fill the holes 220, which are formed at the first dielectric layer 200, and extend from the holes on the first dielectric layer 200. A metal base layer can be formed between the first dielectric layer 200 and the metal trace layer patterns 300 although not shown in FIG. 9. Each metal trace pattern 300 is connected with the conductive pattern 420 of each ball pad section 400 on the same horizontal line as the conductive pattern 420 of each ball pad section 400. The conductive pattern 420 of each ball pad section 400 can be formed at one end of each metal trace pattern 300. The second dielectric layer 500 is formed on the metal trace layer patterns 300 and the first dielectric layer 200. The second dielectric layer 500 has holes 520 such that the ball pad sections 400 can be exposed through the holes 520 (see FIG. 12). The solder balls 600 are provided on the ball pad sections 400. Each solder ball 600 is partially filled in the space 440 defined by the conductive pattern 420. The solder balls 600 are electrically connected to the chip pads 160 through the conductive patterns 420 of the ball pad sections 400 and the metal trace layer patterns 300.

Figure 4:
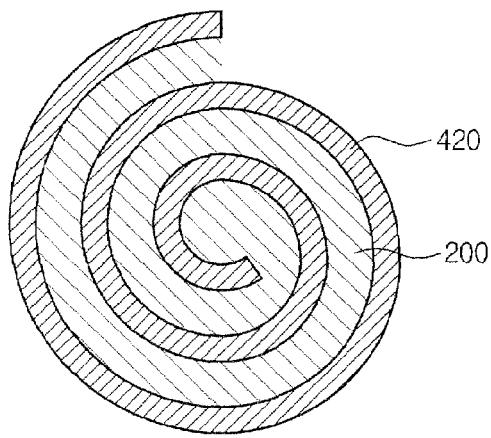
FIG. 4 is a top plan view illustrating an example of the ball pad section of FIG. 3.

FIG. 4 is a top plan view illustrating an example of a shape of each ball pad section 400 according to some embodiments of the present invention. Referring to FIG. 4, the conductive pattern 420 of each ball pad section 400 is connected as a line. The conductive pattern 420 may have a spiral shape. In other words, the conductive pattern 420 may have the shape of a curved line, a radius of curvature of which is gradually increased from its center. In order to enhance the joint reliability of the solder balls 600, the first dielectric layer 200 is exposed through the space, which is defined by the conductive pattern 420, by an area of about 50% or less, when viewed from the top.

According to conventional methods, each ball pad section has a disk-like conductive pattern, and each solder ball is placed on the conductive pattern. In this case, if an area of the conductive pattern increases, a contact area between each solder ball and each ball pad section is increased. This increases the joint reliability between the solder balls and the ball pad sections as well as the parasitic capacitance formed at the dielectric layer and the ball pad sections. If the area of the conductive pattern decreases, the opposite result may occur. However, in the case where the conductive pattern 420 of each ball pad section 400 has the spiral shape as in the present invention, the space 440 defined by the conductive pattern 420 is filled with each solder ball 600 although the area of the conductive pattern 420 is not greatly increased. As a result, the joint reliability between the solder balls 600 and the conductive patterns 420 of the ball pad sections 400 is enhanced.

Further, when viewed from the top, the conductive pattern can be provided on substantially the entire region of each ball pad section, and be bent up and down. In other words, the conductive pattern may have ridges formed in each ball pad section to increase the contact surface area between the solder ball and the conductive pattern. In this case, each solder ball is filled up to the interior of the ridges, so that the joint reliability of the solder balls is enhanced. However, because substantially the entire region of each ball pad section includes the conductive pattern, it is difficult to reduce the parasitic capacitance. Thus, as shown in FIG. 3, when viewed from the top, the first dielectric layer 200 is preferably exposed through the space 440 defined by the conductive pattern 420.

Figure 5:
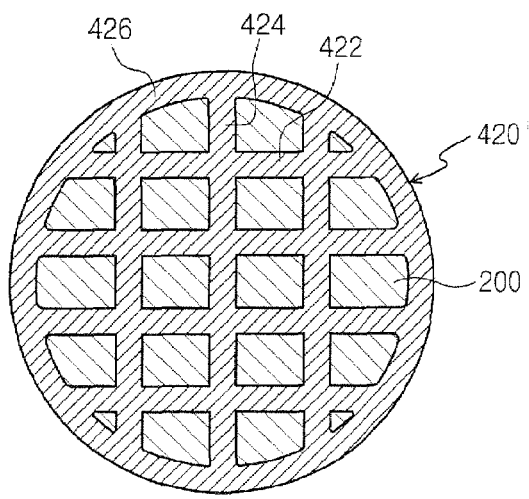
FIG. 5 is a top plan view illustrating another example of the ball pad section of FIG. 3.

FIG. 5 is a top plan view illustrating another example of a conductive pattern 420 of each ball pad section 400. Referring to FIG. 5, the conductive pattern 420 of each ball pad section 400 has the shape of a mesh. Specifically, the conductive pattern 420 includes first metal lines 422 that are parallel to each other in a first direction, and second metal lines 424 that are parallel to each other in a second direction and cross the first metal lines 422. The first and second metal lines 422 and 424 protrude from the first dielectric layer 200. The first direction may be perpendicular to the second direction. Spaces exposing portions of the first dielectric layer 200 are defined between the first and second metal lines 422 and 424. Each solder ball 600 partly fills each space. The conductive pattern 420 may additionally include a third metal line 426 that surrounds and is connected with the first and second metal lines 422 and 424. The third metal line 426 may have a circular shape.

Next, a method for manufacturing the WL-CSP 1 will be described with reference to FIGS. 6 through 13.

Figure 6:
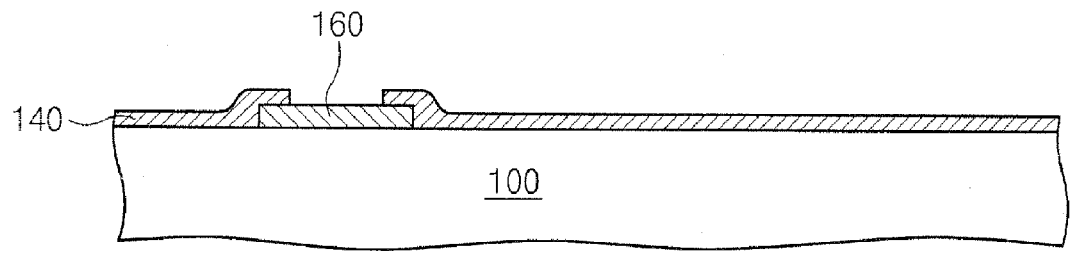
FIGS. 6 through 13 are cross-sectional views illustrating a method for manufacturing a wafer level chip scale package according to embodiments of the present invention.
Figure 7:
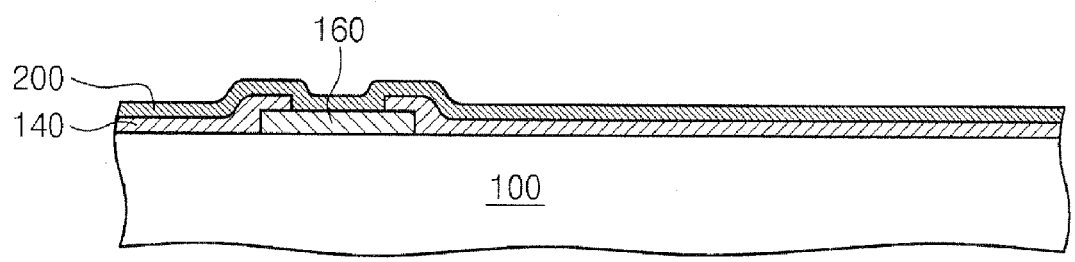

First, a semiconductor wafer 100 having a plurality of semiconductor chips, each of which includes chip pads 160 and a passivation layer 140, is prepared (see FIG. 6). A first dielectric layer 200 is formed on the semiconductor wafer 100 (see FIG. 7). The first dielectric layer 200 is a lower dielectric layer for forming metal trace layer patterns 300 on the passivation layer 140, and is deposited on the passivation layer 140 and the chip pads 160 at a predetermined thickness. The deposition can be performed by chemical vapor deposition, and/or other techniques known in the art. The first dielectric layer 200 is patterned such that the chip pads 160 are exposed (see FIG. 8). The patterning can be performed by a photolithography process, an etching process, and/or other techniques known in the art. Next, in order to redistribute the chip pads 160, the metal trace layer patterns 300 and ball pad sections 400 are formed (see FIG. 9). The metal trace layer patterns 300 and conductive patterns 420 of the ball pad sections 400 can be simultaneously patterned through the photolithography process, the etching process, and so on (see FIG. 10). A space 440 defined by the conductive pattern 420 of each ball pad section 400 is etched such that the first dielectric layer 200 is exposed. As illustrated in FIGS. 4 and 5, the conductive pattern 420 can be patterned in a spiral or a mesh shape. The conductive pattern 420 may also be patterned in other shapes that define a space 440 exposing a portion of the first dielectric layer 200. When the conductive pattern 420 of each ball pad section 400 has the spiral or mesh shape, an area contacting each solder ball 600 can be maximized, so that the joint reliability between the conductive pattern 420 of each ball pad section 400 and each solder ball 600 can be enhanced. Further, because the first dielectric layer 200 is exposed through the space 440 defined by the conductive pattern 420 of each ball pad section 400, the magnitude of the parasitic capacitance can be reduced.

The metal trace layer patterns 300 may be deposited by sputtering, chemical vapor deposition, or plating. Each metal trace layer pattern 300 may be a single layer of copper (Cu) or aluminum (Al), or a multi-layer structure in which several metals are stacked.

Before the metal trace layer patterns 300 are formed, a metal base layer 320 (see FIG. 8), which will be used as an adhesive layer, a diffusion layer, a barrier layer, a plating base layer, or so on of each metal trace layer pattern 300, may be formed under a region in which the metal trace layer pattern 300 will be formed. The metal base layer 320 may be any one selected from layers of titanium/copper (Ti/Cu), titanium-tungsten/copper (TiW/Cu), aluminum/nickel/copper (Al/Ni/Cu), and aluminum/nickel-vanadium/copper (Al/NiV/Cu).

Figure 11:
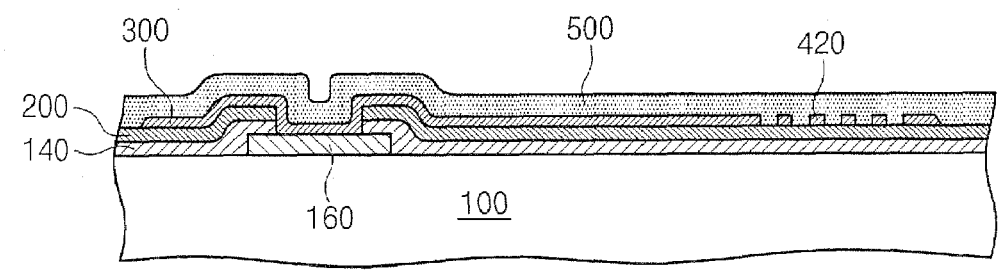

Subsequently, a second dielectric layer 500 is deposited at a predetermined thickness (see FIG. 11). The second dielectric layer 500 has an etching selectivity with respect to the first dielectric layer 200. Then, the second dielectric layer 500 is patterned to expose the ball pad sections 400 through photolithography and etching processes (see FIG. 12). At this time, the conductive pattern 420 and the first dielectric layer 200 are exposed within each ball pad section 400. In order to enhance the ability of the solder balls 600 to form a reliable joint with the ball pad sections 400, an area of the first dielectric layer 200 exposed from each ball pad section 400 is preferably equal to or less than that of the conductive pattern 420, when viewed from the top.

Figure 13:
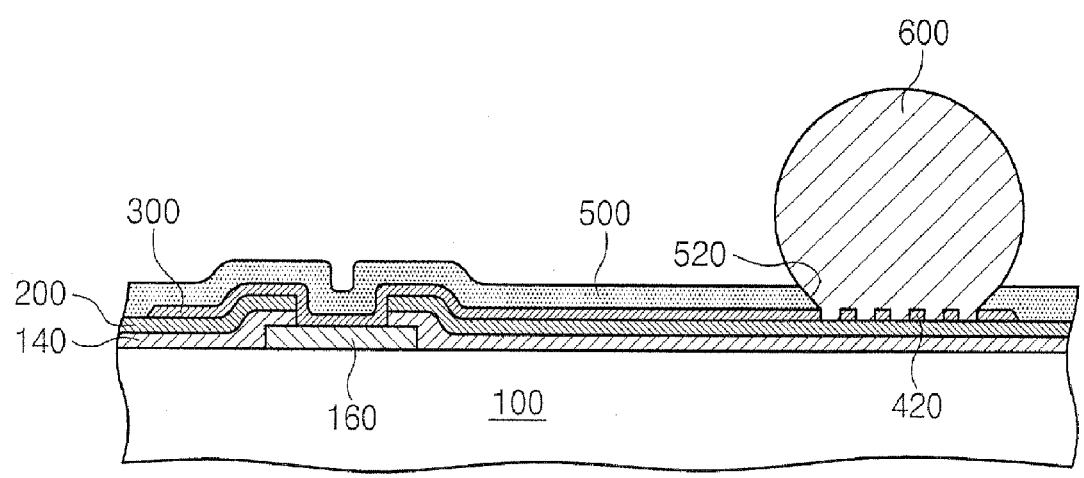

Next, the solder balls 600 are provided to the ball pad sections 400 (see FIG. 13). The solder balls 600, having a substantially spherical shape, are provided on the ball pad sections 400 and are subjected to reflow. Thereby, the solder balls 600 are formed on the ball pad sections 400. The solder balls 600 are electrically connected with the chip pads 160 through the conductive patterns 420 of the ball pad sections 400 and the metal trace layer patterns 300. The solder balls 600 may be formed by ball placement, plating, stencil printing, and/or metal jetting. Finally, individual WL-CSPs are formed by cutting the wafer 100 along chip cutout regions.

According to the present invention, when the solder balls are formed on the ball pads, the parasitic capacitance generated from the ball pads is reduced, and simultaneously the contact area between each solder ball and each ball pad is increased, so that the joint reliability can be enhanced.

Embodiments of the present invention provide a wafer level chip scale package, which includes a semiconductor wafer having a plurality of integrated circuit chips, each of which includes a plurality of chip pads and a passivation layer formed to expose the chip pads on a top surface thereof; a first dielectric layer disposed on the passivation layer such that the chip pads are exposed; ball pad sections having conductive patterns protruding from the first dielectric layer and exposing a portion of the first dielectric layer; metal trace layer patterns disposed on the first dielectric layer so as to connect the conductive patterns of the ball pad sections with the chip pads; a second dielectric layer disposed on the metal trace layer patterns and the first dielectric layer such that the ball pad sections are exposed; and solder balls mounted on the ball pad sections and electrically connected with the conductive patterns of the ball pad sections.

In some embodiments, the conductive patterns have a spiral shape or a mesh shape.

In some embodiments, when viewed from the top, the exposed portion of the first dielectric layer comprises about 50% or less of each ball pad section.

According to other embodiments, the present invention provides a method for manufacturing a wafer level chip scale package, which includes: providing a conductive pattern on a ball pad section of a substrate, the conductive pattern having a spiral shape, wherein the conductive pattern exposes a portion of a dielectric layer disposed under the conductive pattern; and mounting a solder ball on a top surface of each ball pad section such that the solder ball contacts the exposed portion of the dielectric layer.

In still other embodiments, the present invention provides a method for manufacturing a wafer level chip scale package, which includes: providing a conductive pattern on a ball pad section of a substrate, the conductive pattern having a mesh shape, wherein the conductive pattern exposes a portion of a dielectric layer disposed under the conductive pattern; and mounting a solder ball on a top surface of each ball pad section such that the solder ball contacts the exposed portion of the dielectric layer.

In some embodiments, the wafer level chip scale package is formed at a wafer level. Further, the solder ball is mounted on each ball pad section by any one of ball placement, plating, stencil printing, and metal jetting.

According to other embodiments, the present invention provides an apparatus, comprising: a first dielectric layer disposed on a substrate; a metal trace layer pattern including a conductive pattern exposing a portion of the first dielectric layer; and a second dielectric layer disposed on the metal trace layer pattern and the first dielectric layer, the second dielectric layer defining a ball pad section including the conductive pattern and the exposed portions of the first dielectric layer.

According to some embodiments, the substrate comprises: a semiconductor wafer; a chip pad disposed on the semiconductor wafer; and a passivation layer disposed on the chip pad and the semiconductor wafer, the passivation layer defining an opening exposing a portion of the chip pad.

According to some embodiments, the apparatus further comprises a solder ball disposed on the ball pad section such that the solder ball contacts the conductive pattern and the exposed portion of the first dielectric layer, wherein the metal trace layer pattern electrically connects the chip pad to the solder ball.

According to some embodiments, the conductive pattern comprises one of a spiral pattern and a mesh pattern and the portion of the first dielectric layer exposed by the conductive pattern comprises about 50% or less of the ball pad section.

According to still other embodiments, the present invention provides a method, comprising: providing a substrate including a chip pad and a passivation layer, the passivation layer defining a first opening exposing a portion of a top surface of the chip pad; forming a first dielectric layer on the passivation layer; forming a metal trace layer pattern on the first dielectric layer and the chip pad, wherein the metal trace layer pattern comprises a ball pad section including a conductive pattern, the conductive pattern exposing a portion of the first dielectric layer; forming a second dielectric layer on the metal trace layer pattern and the first dielectric layer, the second dielectric layer defining a second opening exposing the ball pad section; and mounting a solder ball on the ball pad section such that the solder ball contacts the conductive pattern and the exposed portion of the first dielectric layer.

According to some embodiments, the conductive pattern comprises one of a spiral pattern and a mesh pattern.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A wafer level chip scale package, comprising:
   an integrated circuit (IC) chip, the IC chip including a plurality of chip pads and a passivation layer exposing the chip pads on a top surface thereof;
   a first dielectric layer disposed on the passivation layer, the first dielectric layer defining a plurality of first openings such that the chip pads are exposed;
   ball pad sections having conductive patterns protruding from the first dielectric layer and exposing a portion of the first dielectric layer;
   trace layer patterns disposed on the first dielectric layer so as to connect the conductive patterns of the ball pad sections with the chip pads;
   a second dielectric layer formed on the trace layer patterns and the first dielectric layer, the second dielectric layer defining a plurality of second openings such that the ball pad sections are exposed; and
   conductive balls disposed on the ball pad sections and electrically connected with the conductive patterns of the ball pad sections.

2. The wafer level chip scale package of claim 1, wherein the conductive patterns have a spiral shape.

3. The wafer level chip scale package of claim 1, wherein the conductive patterns have a mesh shape.

4. The wafer level chip scale package of claim 1, wherein the exposed portions of the first dielectric layer comprise about 50% or less of each ball pad section.

5. The wafer level chip scale package of claim 1, further comprising a base layer between the first dielectric layer and the trace layer patterns.

6. The wafer level chip scale package of claim 5, wherein the base layer includes one or more of titanium/copper (Ti/Cu), titanium-tungsten/copper (TiW/Cu), aluminum/nickel/copper (Al/Ni/Cu), and aluminum/nickel-vanadium/copper (Al/NiV/Cu).

7. The wafer level chip scale package of claim 1, wherein the trace layer patterns each include one or more of copper and aluminum.

* * * * *